United States Patent
Ho et al.

(10) Patent No.: US 8,904,314 B1
(45) Date of Patent: Dec. 2, 2014

(54) RC EXTRACTION FOR MULTIPLE PATTERNING LAYOUT DESIGN

(71) Applicant: Taiwan Semiconductor Manufacturing Company Limited, Hsin-Chu (TW)

(72) Inventors: Chia-Ming Ho, Hsinchu (TW); Te-Yu Liu, Xinpu Township (TW); Ke-Ying Su, Taipei (TW); Hsien-Hsin Lee, Duluth, GA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/030,672

(22) Filed: Sep. 18, 2013

Related U.S. Application Data (60) Provisional application No. 61/862,350, filed on Aug. 5, 2013.

(51) Int. Cl.
*G06F 17/50* (2006.01)
(52) U.S. Cl.
CPC ........ *G06F 17/5081* (2013.01); *G06F 17/5072* (2013.01)
USPC .............................................. 716/52; 715/115
(58) Field of Classification Search
CPC ................. G06F 17/50–17/5081; G03F 1/68; G03F 1/70; G03F 7/70425; G03F 7/70466
See application file for complete search history.

(56) References Cited

U.S. PATENT DOCUMENTS

| | | | |
|---|---|---|---|
| 8,612,902 B1* | 12/2013 | Agarwal et al. | 716/54 |
| 2011/0179393 A1* | 7/2011 | Xue et al. | 716/55 |
| 2011/0202892 A1* | 8/2011 | Lee et al. | 716/53 |
| 2011/0288671 A1* | 11/2011 | Agarwal | 700/104 |

* cited by examiner

*Primary Examiner* — Leigh Garbowski
(74) *Attorney, Agent, or Firm* — Cooper Legal Group, LLC (57) ABSTRACT

Among other things, one or more systems and techniques for width bias adjustment for a design layout are provided. During fabrication, characteristics of a component can change, such as size, width, position, etc., from how a design layout represents such components. Accordingly, a width bias table is used to identify a width bias value that can be applied between a first polygon and a second polygon to compensate for a characteristic change associated with at least one of the first polygon and the second polygon during fabrication. The width bias value is used during RC extraction to determine an electrical characteristic adjustment, such as an additional capacitance or resistance associated with the width bias value, for at least one of the first polygon and the second polygon. In this way, RC extraction, during a design phase, can take into account electrical characteristic changes that occur during fabrication.

20 Claims, 8 Drawing Sheets

RC EXTRACTION FOR MULTIPLE PATTERNING LAYOUT DESIGN

BACKGROUND

Electronic design tools allow designers to layout, simulate, and analyze electrical components, such as integrated circuits. In an example, a schematic designer creates a schematic diagram of an integrated circuit. The schematic diagram comprises symbols that represent components of the integrated circuit. However, the schematic diagram does not represent a physical layout of the integrated circuit. A layout designer creates a design layout of the integrated circuit using the schematic diagram. The design layout comprises one or more polygons representing metal, silicon, or other components or portions thereof. During fabrication of the integrated circuit, physical characteristics of components, such as size, shape, position, or electrical properties, can differ than how the design layout represented such components. In an example, first mask is used to form a first set of metal components and a second mask is used to form a second set of metal components. During fabrication, a spacer structure is used around the first mask to separate the first mask from the second mask. The spacer structure can partially block or cut off formation of a metal component formed by the second mask based upon the spacer structure overlapping a corresponding portion of the second mask, thus resulting in a change to the size and shape of the metal component. The change in size and shape can change operational characteristics of the integrated circuit not accounted for in the design layout.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

Figure 1:
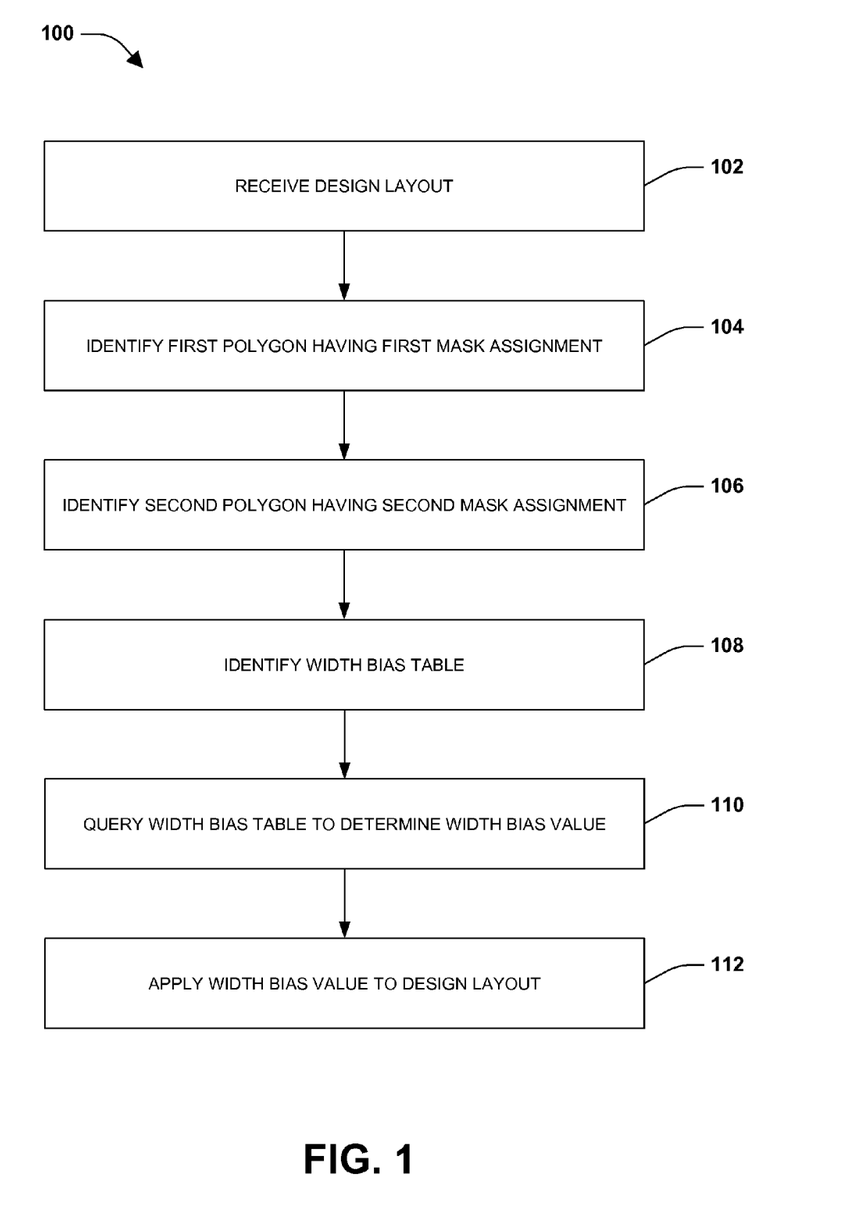
FIG. 1 is a flow diagram illustrating a method of width bias adjustment for a design layout, according to some embodiments.

A method 100 of width bias adjustment for a design layout is illustrated in FIG. 1. At 102, a design layout of an integrated circuit is received. The design layout comprises one or more polygons representing components of the integrated circuit or portions thereof, such as a metal structure or line. In an embodiment, the design layout corresponds to a multiple pattern layout, such as a double patterning layout or a triple patterning layout. At 104, a first polygon having a first mask assignment within the design layout is identified. At 106, a second polygon having a second mask assignment within the design layout is identified. In an embodiment, the first mask assignment assigns the first polygon to first pattern mask that will be used during fabrication to form the first polygon. In an embodiment, the second mask assignment assigns the second polygon to the first pattern mask. In an embodiment, the second mask assignment assigns the second polygon to a second pattern mask different than the first pattern mask. In an embodiment, the second polygon is identified based upon a neighboring relationship with respect to the first polygon, such as a direct neighbor relationship where the second polygon is directly adjacent to the first polygon (e.g., first polygon 304 is directly adjacent to second polygon 306 of FIG. 3) or an in-direct neighbor relationship where the second polygon is positioned relative to the first polygon (e.g., third polygon 406 is an indirect neighbor of first polygon 502 of FIG. 5).

At 108, a width bias table is identified based upon the first mask assignment and the second mask assignment. In an embodiment, a plurality of width bias tables are defined for pattern mask pairings, such as a first width bias table for a pattern mask (A) paired with a pattern mask (B), a second width bias table for the pattern mask (B) paired the pattern mask (A), a third width bias table for the pattern mask (A) paired with the pattern mask (A), etc. (e.g., width bias tables 316-322 of FIG. 3). In an embodiment, the first width bias table corresponds to where pattern mask (A) is a victim mask and pattern mask (B) is an aggressor mask such that during fabrication the pattern mask (B), such as a spacer structure around pattern mask (B), partially blocks or cuts off formation of a polygon by pattern mask (A). The spacer structure associated with the aggressor mask can modify a characteristic of the first polygon, such as a shape or size. In an embodiment, the second width bias table correspond to where pattern mask (B) is a victim mask and pattern mask (A) is an aggressor mask such that during fabrication pattern mask (A) partially blocks or cuts off formation of a polygon by pattern mask (B). In this way, the width bias table is identified based upon whether at least one of the first mask assignment or the second mask assignment corresponds to an aggressor mask or a victim mask.

At 110, the width bias table is queried using a first width between the first polygon and the second polygon to determine a width bias value. The width bias table comprises width bias values that are indexed based upon widths between polygons. In an embodiment, the width bias values are indexed based upon polygon sizes, such as a width of a polygon. A query is formulated based upon the first width a polygon size associated with at least one of the first polygon or the second polygon. The query is executed against the width bias table to identify the width bias value. The width bias value corresponds to a difference is width specified by the design layout and a physical width of the fabricated integrated circuit. That is, the design layout various layout characters for the first polygon and the second polygon, such as a width between the first polygon and the second polygon, a width of the first polygon, a length of the first polygon, a shape of the first polygon, etc. However, during fabrication of the integrated circuit, various characteristics of the first polygon can change, such as the width between the first polygon and the second polygon due to a spacer structure used during fabrication to separate patterning masks. The change in width can result in different electrical characteristics for components formed by the first polygon and the second polygon, such as a capacitance or resistance of a metal line formed by the first polygon. At 112, the width bias value is applied to the design layout, such as during design time to model the change in characteristics to the first polygon or the second polygon during fabrication. In an embodiment, an electrical characteristic adjustment for the first polygon is determined based upon the width bias value, such as a resistance value of a capacitance value introduced by the change in width between the first polygon and the second polygon during fabrication. The electrical characteristic adjustment is taken into account during an RC extraction stage for the design layout.

Figure 2:
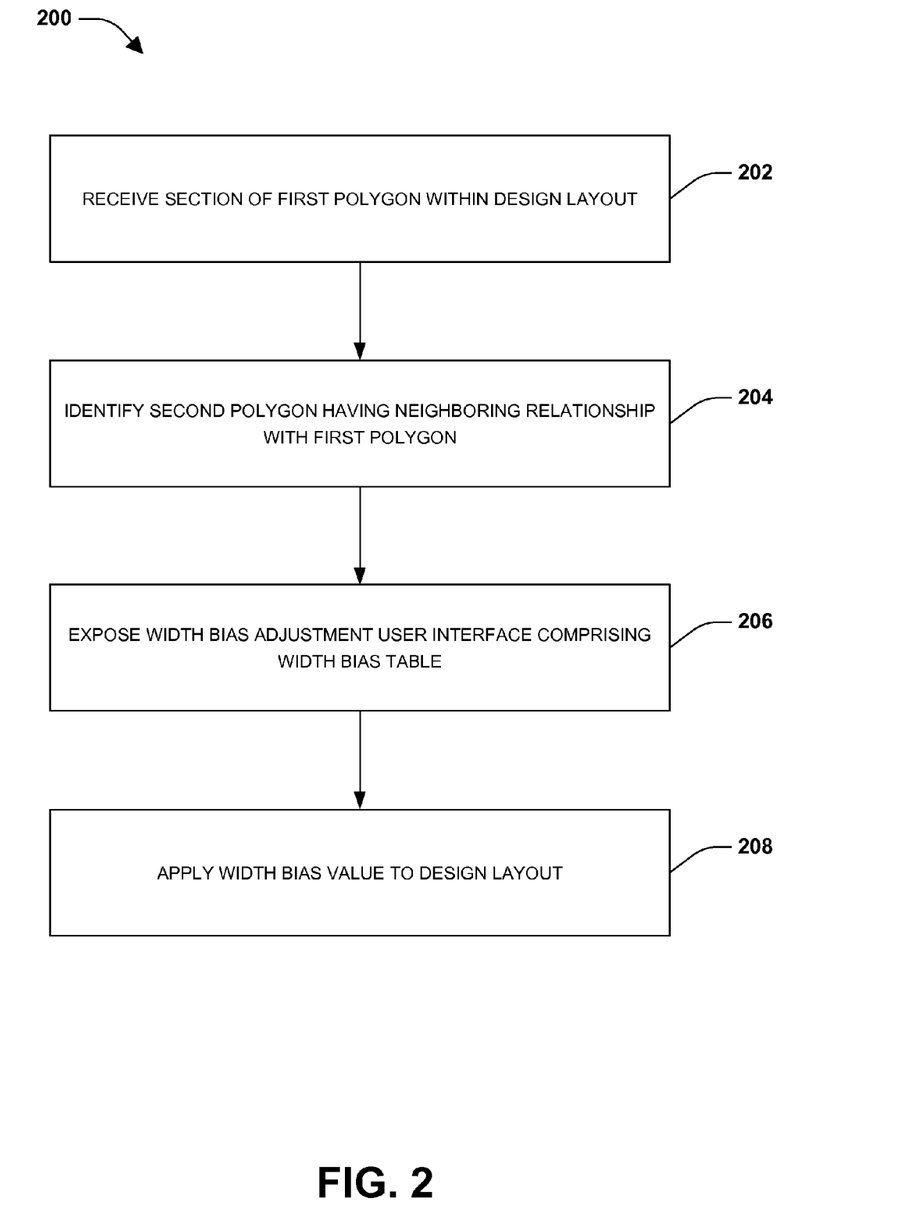
FIG. 2 is a flow diagram illustrating a method of width bias adjustment for a design layout, according to some embodiments.

A method 200 of width bias adjustment for a design layout is illustrated in FIG. 2. A designer can create a design layout for an integrated circuit, represented by a schematic diagram, using a design layout interface (e.g., FIG. 6). Components of the integrated circuit, such as metal lines, are represented in the design layout as polygons. During fabrication of the integrated circuit, characteristics of a component can change from how the design layout represents corresponding polygons. Accordingly, such changes are modeled and taken into account during design time to accurately reflect changes in resistance, capacitance, or other characteristics affected during fabrication. At 202, a selection of a first polygon have a first mask assignment is received. At 204, a second polygon having a neighboring relationship, such as a direct or indirect neighbor, with the first polygon is identified. At 206, a width bias adjustment user interface is exposed through the design layout interface. The width bias adjustment user interface comprises a width bias table corresponding to the first mask assignment and the second mask assignment. At 208, responsive to receiving a selection of a width bias value from the width bias table, the width bias value is applied to the design layout. In an embodiment, an electrical characteristic adjustment for the first polygon is determined based upon the width bias value, and is taken into account during an RC extraction stage of the design layout.

Figure 3:
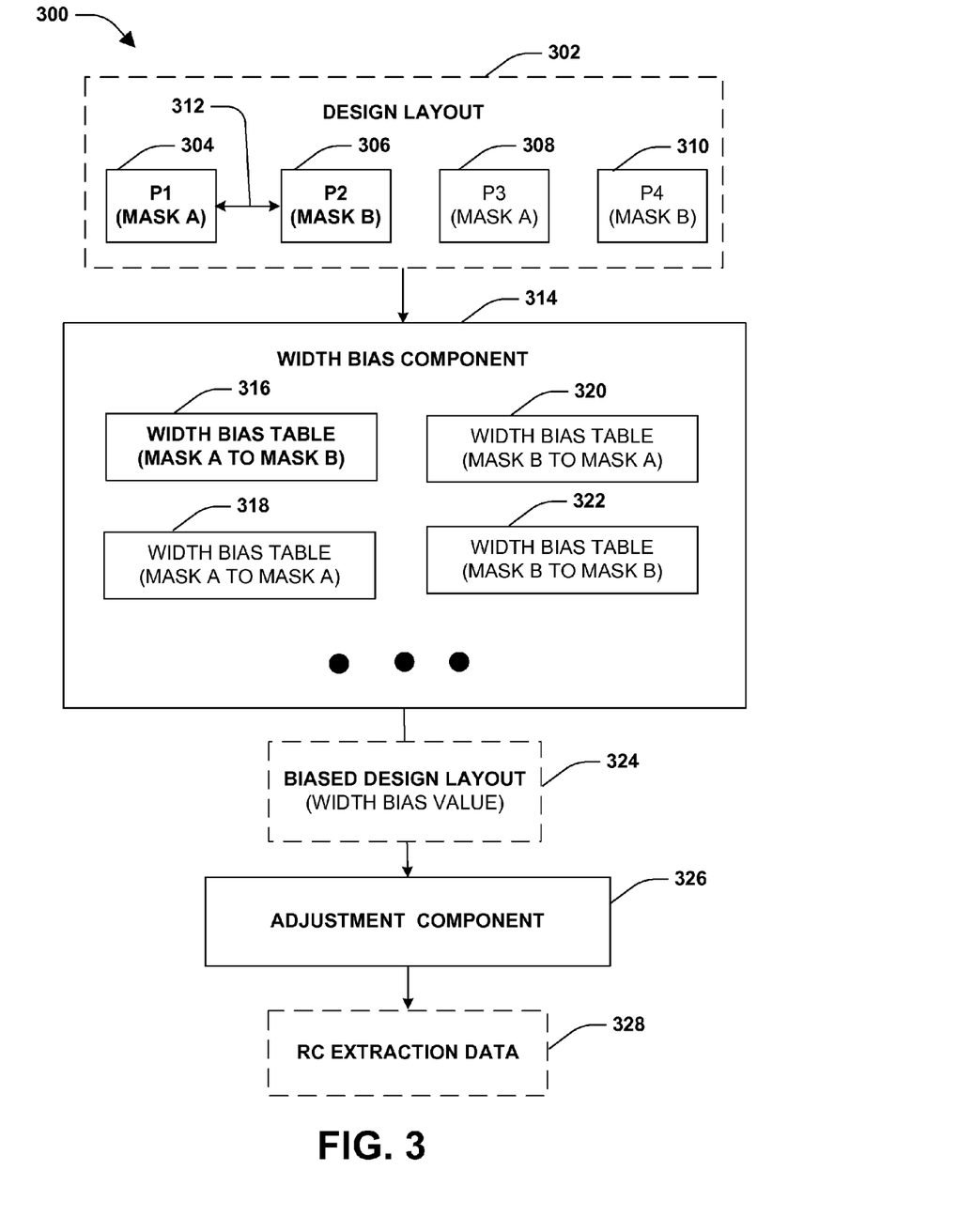
FIG. 3 is an illustration of a system for width bias adjustment for a design layout, according to some embodiments.

FIG. 3 illustrates a system 300 for width bias adjustment for a design layout 302. The design layout 302 comprises a first polygon 304, a second polygon 306, a third polygon 308, a fourth polygon 310, or other polygons not illustrated. The first polygon 304 has a first mask assignment specifying that the first polygon 304 is to be formed by a pattern mask (A). The second polygon 306 has a second mask assignment specifying that the second polygon 306 is to be formed by a pattern mask (B). The third polygon 308 has a third mask assignment specifying that the third polygon 308 is to be formed by a pattern mask (A). The fourth polygon 310 has a fourth mask assignment specifying that the fourth polygon 310 is to be formed by a pattern mask (B).

The system 300 comprises a width bias component 314 associated with one or more width bias tables, such as a first width bias table 316 for a pattern mask (A) to pattern mask (B) pairing (e.g., where pattern mask (A) is a victim mask and pattern mask (B) is an aggressor mask that can partially block or cut off formation of the first polygon 304 by the pattern mask (A) during fabrication), a second width bias table 318 for a pattern mask (A) to pattern mask (A) pairing, a third width bias table 320 for a pattern mask (B) to pattern mask (A) pairing (e.g., where pattern mask (B) is a victim mask and pattern mask (A) is an aggressor mask that can partially block or cut off formation of the second polygon 306 by the pattern mask (B) during fabrication), and a fourth width bias table for a pattern mask (B) to pattern mask (B) pairing.

The width bias component 314 identified the first polygon 304 and the second polygon 306. The width bias component 314 identifies the first width bias table 316 based upon the first mask assignment of the first polygon 304 and the second mask assignment of the second polygon 306. The width bias component 314 queries the first width bias table 316 using a width 312 between the first polygon 304 and the second polygon 306 to identify a width bias value. The width bias value is applied to the design layout 302 to adjust for changes to characteristics of the first polygon 304 during fabrication, thus resulting in biased design layout 324.

The system 300 comprises an adjustment component 326 configured to determine an electrical characteristic adjustment for the first polygon 304 based upon the width bias value. The adjustment component 326 takes the electrical characteristic adjustment into account during an RC extraction stage for the design layout 302, resulting in RC extraction data 328 that takes into account changes to the first polygon 304 during fabrication, such as a modified to a shape or size of the first polygon 304 from a spacer structure associated with the pattern mask (B).

Figure 4:
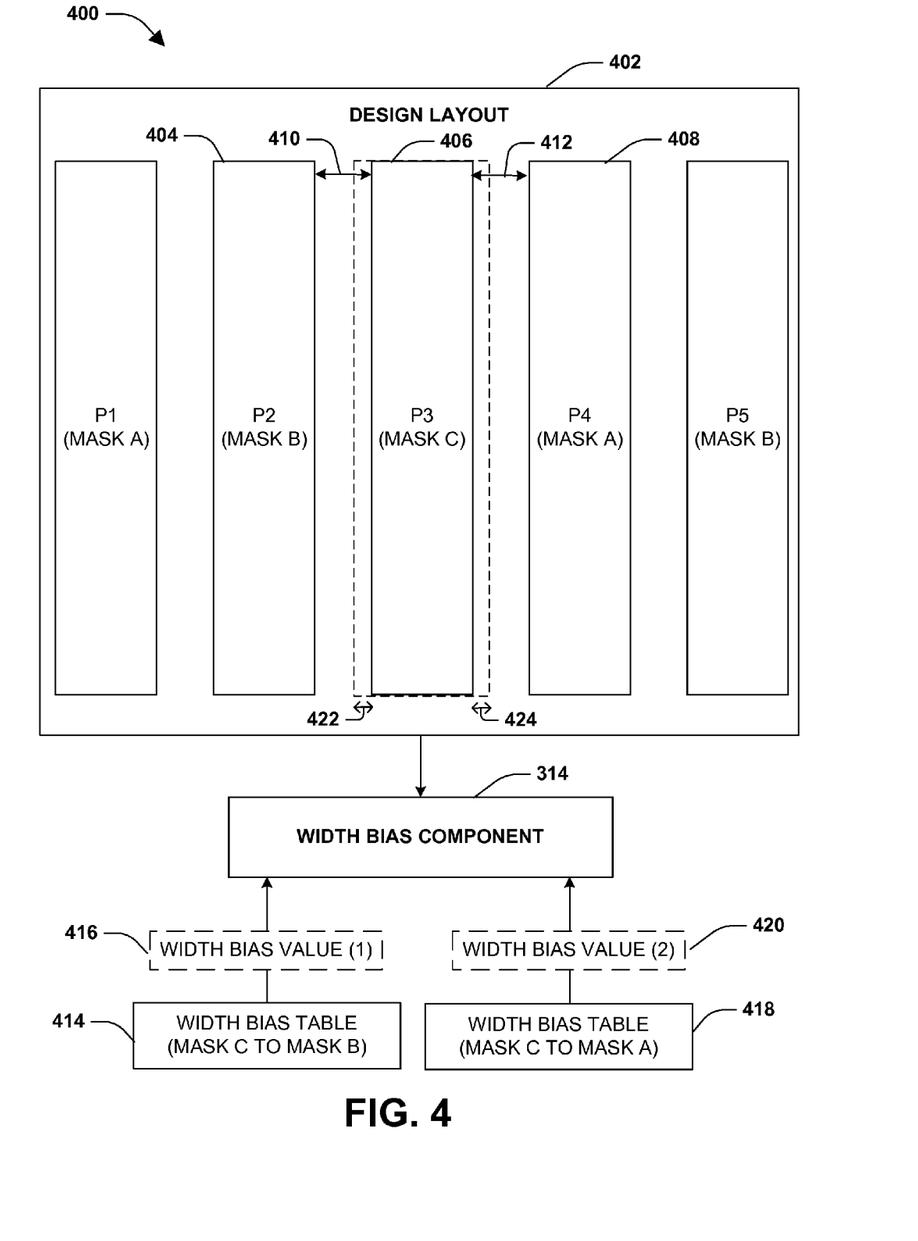
FIG. 4 is an illustration of a system for width bias adjustment for a triple patterning design layout, according to some embodiments.

FIG. 4 illustrates a system 400 for width bias adjustment for a design layout 402. The design layout 402 comprises a triple patterning design layout where a pattern mask (A), pattern mask (B), and pattern mask (C) are used to form polygons of the design layout 402 during fabrication. The system 400 comprises a width bias component 314. The width bias component 314 identifies a third polygon 406 having a third polygon mask assignment to the pattern mask (C). The width bias component 314 identifies a second polygon 404 having a second polygon mask assignment to the pattern mask (B) based upon the second polygon 404 being a direct neighbor of the third polygon 406. The width bias component 314 queries a first width bias table 414 for a pattern mask (C) to pattern mask (B) pairing using a first width 410 between the third polygon 406 and the second polygon 404 to determine a first width bias value 416. The first width bias value 416 is used to adjust 422 the third polygon 406, such as increase a size of the third polygon 406. In an embodiment, the width bias component identifies a fourth polygon 408 having a fourth polygon mask assignment to the pattern mask (A) based upon the fourth polygon 408 being a direct neighbor of the third polygon 406. The width bias component 314 queries a second width bias table 418 for a pattern mask (C) to pattern mask (A) pairing using a second width 412 between the third polygon 406 and the fourth polygon 408 to determine a second width bias value 420. The second width bias value 420 is used to adjust 424 the third polygon 406, such as increase a size of the third polygon 406.

Figure 5:
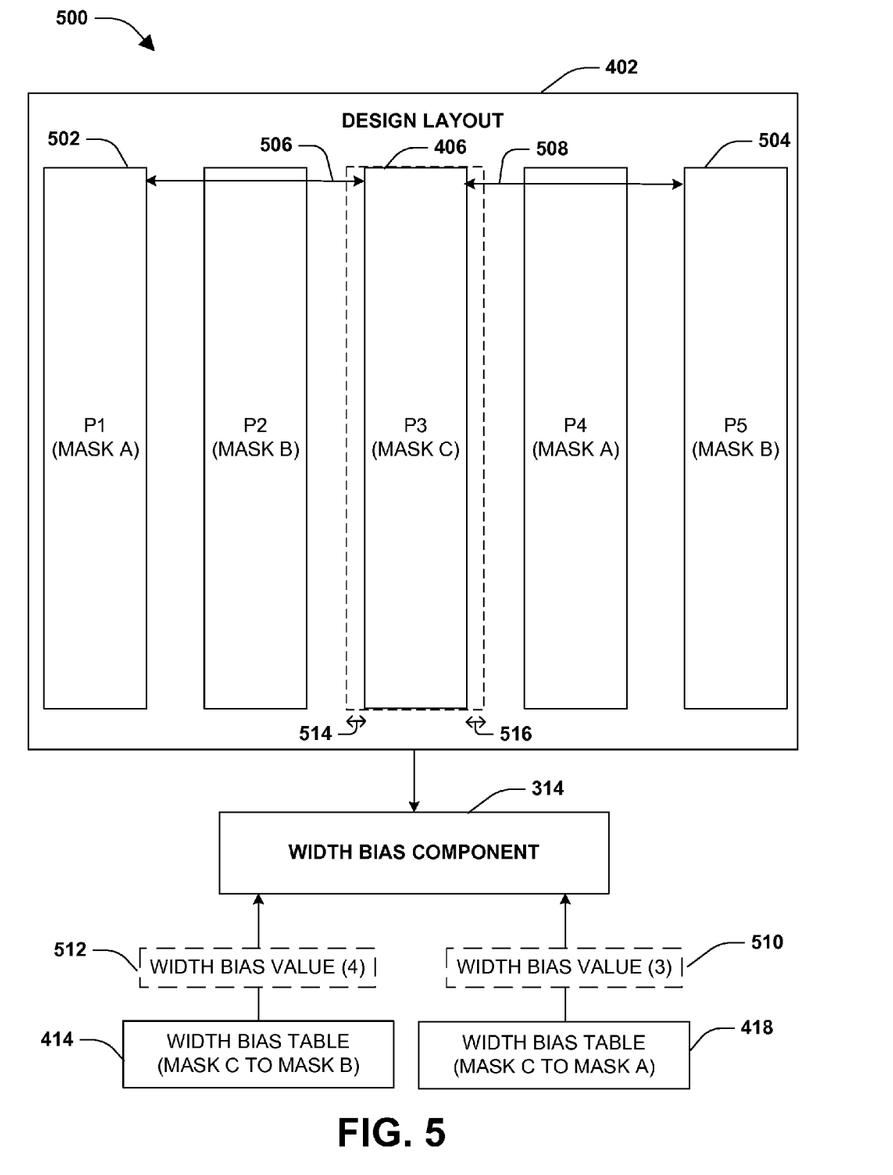
FIG. 5 is an illustration of a system for width bias adjustment for a design layout, according to some embodiments.

FIG. 5 illustrates a system 500 for width bias adjustment for a design layout 502. The system 500 comprises a width bias component 314 configured to compare indirect neighbor polygons. The width bias component 314 identifies a third polygon 406 having a third polygon mask assignment to the pattern mask (C). The width bias component 314 identifies a first polygon 502 having a first polygon mask assignment to the pattern mask (A) based upon the first polygon 502 being an indirect neighbor of the third polygon 406. The width bias component 314 queries a second width bias table 418 for a pattern mask (C) to pattern mask (B) pairing using a third width 506 between the third polygon 406 and the first polygon 502 to determine a third width bias value 510. The third width bias value 510 is used to adjust 514 the third polygon 406, such as increase a size of the third polygon 406. In an embodiment, the width bias component identifies a fifth polygon 504 having a fifth polygon mask assignment to the pattern mask (B) based upon the first polygon 504 being an indirect neighbor of the third polygon 406. The width bias component 314 queries a first width bias table 414 for a pattern mask (C) to pattern mask (B) pairing using a fourth width 508 between the third polygon 406 and the fifth polygon 504 to determine a fourth width bias value 512. The fourth width bias value 512 is used to adjust 516 the third polygon 406, such as increase a size of the third polygon 406.

Figure 6:
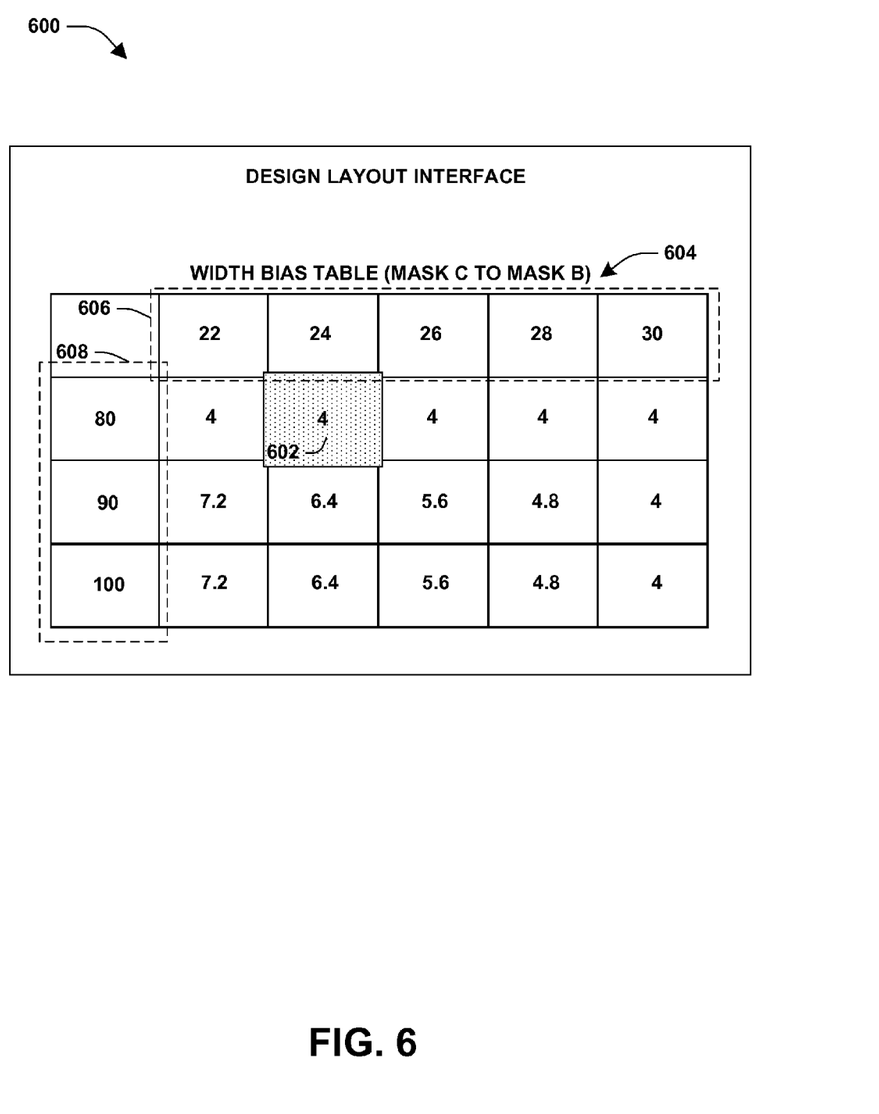
FIG. 6 is an illustration of a design layout interface, according to some embodiments.

FIG. 6 illustrates a design layout interface 600. A width bias table 604 for a pattern mask (C) to pattern mask (B) pairing is displayed through the design layout interface 600 based upon a selection of a first polygon, having a first mask assignment to a pattern mask (C), and a second polygon having a second mask assignment to a pattern mask (B). The width bias table 604 comprises a plurality of width bias value that are indexed by width values between polygons, represented along y-axis 608, and indexed by polygon size values represented along x-axis 606. In an embodiment, a width bias value 602 of 4 corresponds to a polygon size of 24 nm and a width between polygons of 80 nm. In this way, the width bias table is displayed through the design layout interface 600 based upon a selection of the first polygon. The designer can select a width bias value to apply to the first polygon from the width bias table 604. This width bias value is applied to the first polygon and an electrical characteristic adjustment for the first polygon is taken into account during RC extraction of the design layout.

Figure 7:
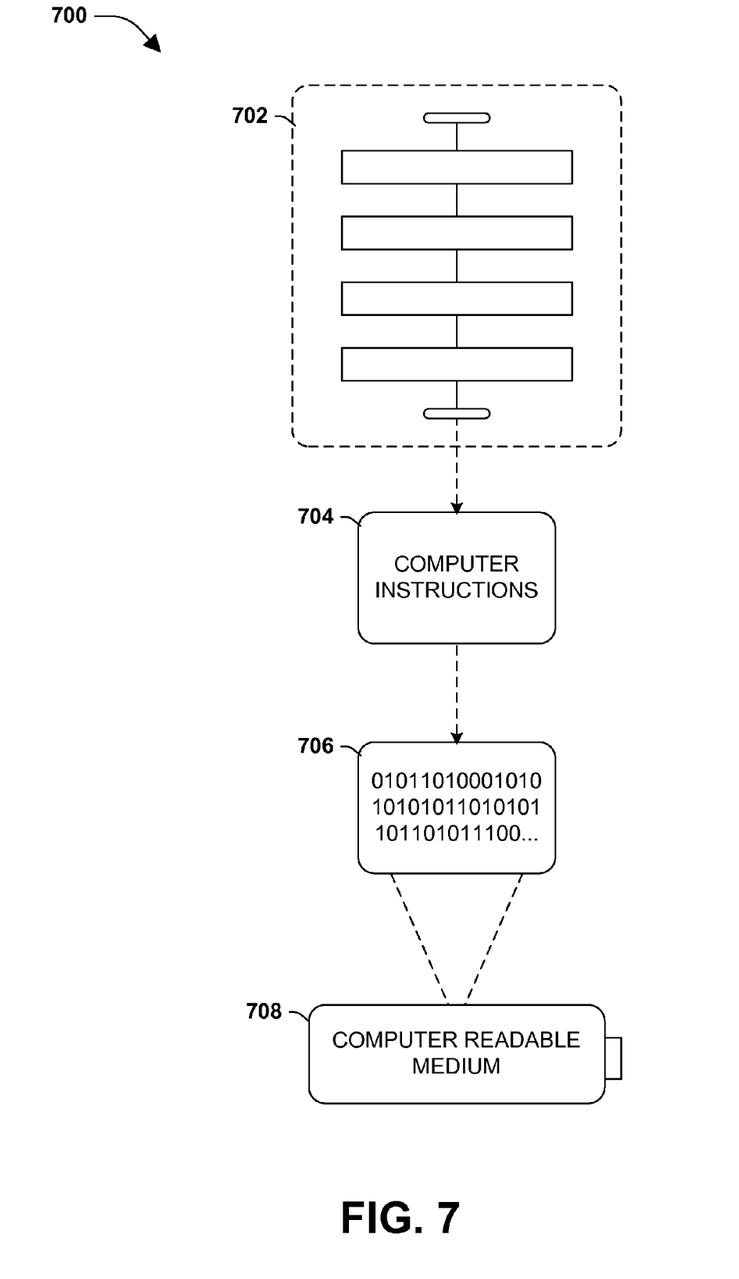
FIG. 7 is an illustration of an example computer-readable medium wherein processor-executable instructions configured to embody one or more of the provisions set forth herein may be comprised.

Still another embodiment involves a computer-readable medium comprising processor-executable instructions configured to implement one or more of the techniques presented herein. An exemplary computer-readable medium is illustrated in FIG. 7, wherein the implementation 700 comprises a computer-readable medium 708 (e.g., a CD-R, DVD-R, flash drive, a platter of a hard disk drive, etc.), on which is encoded computer-readable data 706. This computer-readable data 706 in turn comprises a set of computer instructions 704 configured to operate according to one or more of the principles set forth herein. In one such embodiment 700, the processor-executable computer instructions 704 may be configured to perform a method 702, such as at least some of the exemplary method 100 of FIG. 1 and/or at least some of the exemplary method 200 of FIG. 2, for example. In another such embodiment, the processor-executable instructions 712 may be configured to implement a system, such as at least some of the exemplary system 300 of FIG. 3, at least some of the exemplary system 400 of FIG. 4, and/or at least some of the exemplary system 500 of FIG. 5, for example. Many such computer-readable media may be devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some the claims.

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, many modifications may be made to this configuration without departing from the scope or spirit of the claimed subject matter.

Figure 8:
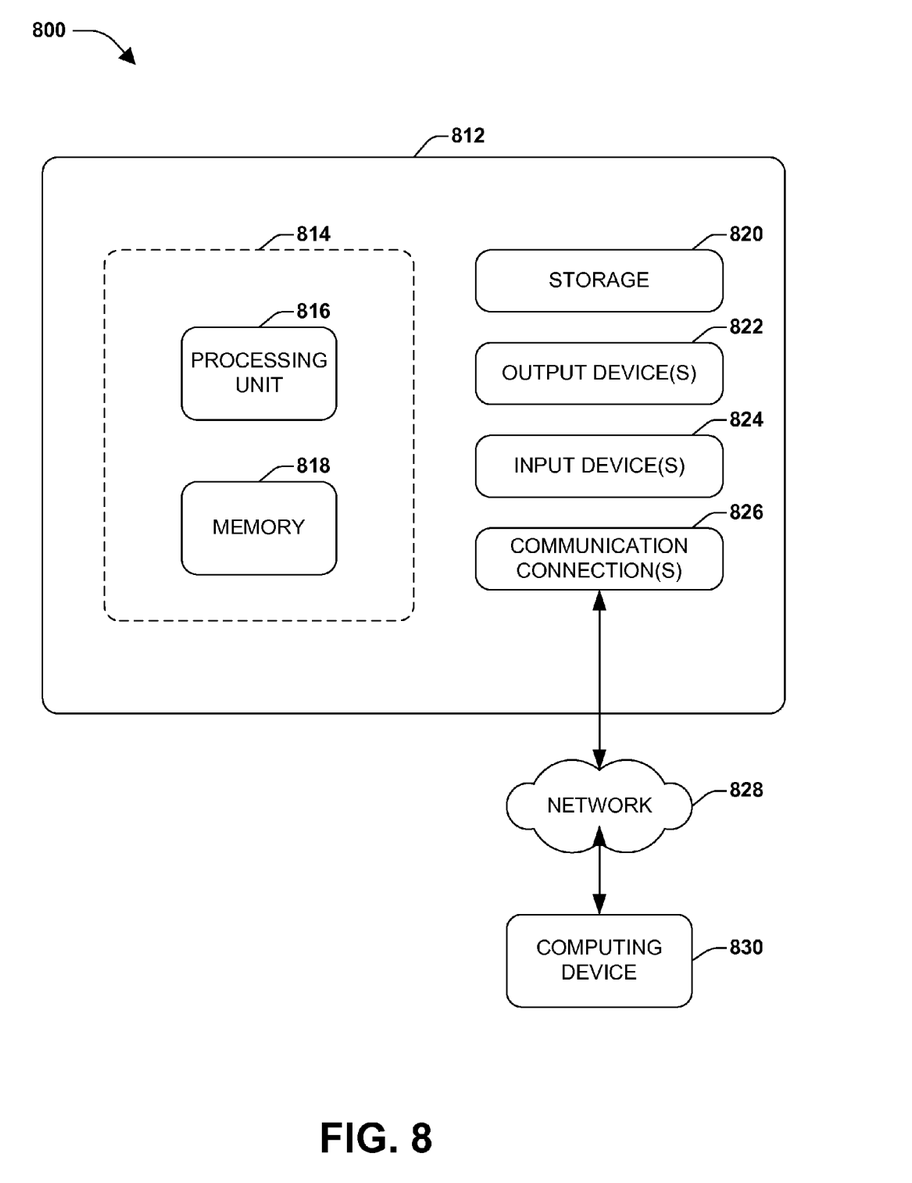
FIG. 8 illustrates an example computing environment wherein one or more of the provisions set forth herein may be implemented.

FIG. 8 and the following discussion provide a brief, general description of a suitable computing environment to implement embodiments of one or more of the provisions set forth herein. The operating environment of FIG. 8 is only one example of a suitable operating environment and is not intended to suggest any limitation as to the scope of use or functionality of the operating environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 illustrates an example of a system 800 comprising a computing device 812 configured to implement one or more embodiments provided herein. In one configuration, computing device 812 includes at least one processing unit 816 and memory 818. Depending on the exact configuration and type of computing device, memory 818 may be volatile (such as RAM, for example), non-volatile (such as ROM, flash memory, etc., for example) or some combination of the two. This configuration is illustrated in FIG. 8 by dashed line 814.

In other embodiments, device 812 may include additional features and/or functionality. For example, device 812 may also include additional storage (e.g., removable and/or non-removable) including, but not limited to, magnetic storage, optical storage, and the like. Such additional storage is illustrated in FIG. 8 by storage 820. In some embodiments, computer readable instructions to implement one or more embodiments provided herein may be in storage 820. Storage 820 may also store other computer readable instructions to implement an operating system, an application program, and the like. Computer readable instructions may be loaded in memory 818 for execution by processing unit 816, for example.

The term "computer readable media" as used herein includes computer storage media. Computer storage media includes volatile and nonvolatile, removable and non-removable media implemented in any method or technology for storage of information such as computer readable instructions or other data. Memory 818 and storage 820 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 812. Any such computer storage media may be part of device 812.

Device 812 may also include communication connection(s) 826 that allows device 812 to communicate with other devices. Communication connection(s) 826 may include, but is not limited to, a modem, a Network Interface Card (NIC), an integrated network interface, a radio frequency transmitter/receiver, an infrared port, a USB connection, or other interfaces for connecting computing device 812 to other computing devices. Communication connection(s) 826 may include a wired connection or a wireless connection. Communication connection(s) 826 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

Device 812 may include input device(s) 824 such as keyboard, mouse, pen, voice input device, touch input device, infrared cameras, video input devices, and/or any other input device. Output device(s) 822 such as one or more displays, speakers, printers, and/or any other output device may also be included in device 812. Input device(s) 824 and output device(s) 822 may be connected to device 812 via a wired connection, wireless connection, or any combination thereof. In some embodiments, an input device or an output device from another computing device may be used as input device(s) 824 or output device(s) 822 for computing device 812.

Components of computing device 812 may be connected by various interconnects, such as a bus. Such interconnects may include a Peripheral Component Interconnect (PCI), such as PCI Express, a Universal Serial Bus (USB), firewire (IEEE 1394), an optical bus structure, and the like. In another embodiment, components of computing device 812 may be interconnected by a network. For example, memory 818 may be comprised of multiple physical memory units located in different physical locations interconnected by a network.

Those skilled in the art will realize that storage devices utilized to store computer readable instructions may be distributed across a network. For example, a computing device 830 accessible via a network 828 may store computer readable instructions to implement one or more embodiments provided herein. Computing device 812 may access computing device 830 and download a part or all of the computer readable instructions for execution. Alternatively, computing device 812 may download pieces of the computer readable instructions, as needed, or some instructions may be executed at computing device 812 and some at computing device 830.

According to an aspect of the instant disclosure, a method for width bias adjustment for a design layout is provided. The method comprises receiving a design layout of an integrated circuit. A first polygon having a first mask assignment is identified within the design layout. A second polygon having a second mask assignment is identified within the design layout. A width bias table is identified based upon the first mask assignment and the second mask assignment. The width bias table is queried using a first width between the first polygon and the second polygon to determine a width bias value. The width bias value is applied to the design layout.

According to an aspect of the instant disclosure, a system for width bias adjustment for a design layout is provided. The system comprises a width bias component configured to receiving a design layout for an integrated circuit. The width bias component identifies a first polygon having a first mask assignment within the design layout. The width bias component identifies a second polygon having a second mask assignment within the design layout. The width bias component identifies a width bias table based upon the first mask assignment and the second mask assignment. The width bias component queries the width bias table using a first width between the first polygon and the second polygon to determine a width bias value. The width bias value is applied to the design layout.

According to an aspect of the instant disclosure, a method for width bias adjustment for a design layout is provided. The method comprises receiving a selection of a first polygon within a design layout of an integrated circuit. The first polygon has a first mask assignment. A second polygon having a neighboring relationship with the first polygon is identified. The second polygon has a second mask assignment. A width bias adjustment user interface, comprising a width bias table corresponding to the first mask assignment and the second mask assignment, is exposed. Responsive to selection of a width bias value from the width bias table, the width bias value is applied to the design layout.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for width bias adjustment for a design layout, comprising:
  receiving a design layout of an integrated circuit;
  identifying a first polygon having a first mask assignment within the design layout;
  identifying a second polygon having a second mask assignment within the design layout;
  identifying a width bias table based upon the first mask assignment and the second mask assignment;
  querying the width bias table using a first width between the first polygon and the second polygon to determine a width bias value; and
  applying the width bias value to the design layout, comprising:
    determining an electrical characteristic adjustment for the first polygon based upon the width bias value; and
    taking the electrical characteristic adjustment into account during an RC extraction stage for the design layout,
  at least some of the method implemented at least in part via a processing unit.

2. The method of claim 1, comprising determining an aggressor/victim relationship between a first mask used to form the first polygon and a second mask used to form the second polygon based upon the first mask assignment and the second mask assignment.

3. The method of claim 2, the identifying a width bias table comprising:
  identifying the width bias table based upon the aggressor/victim relationship.

4. The method of claim 1, the electrical characteristic adjustment corresponding to at least one of a capacitance value or a resistance value.

5. The method of claim 1, the querying comprising:
  formulating a query based upon the first width and a polygon size associated with at least one of the first polygon or the second polygon; and
  executing the query against the width bias table.

6. The method of claim 1, the first mask assignment corresponding to a first mask and the second mask assignment corresponding to a second mask different than the first mask.

7. The method of claim 1, the first mask assignment corresponding to a first mask and the second mask assignment corresponding to the first mask.

8. The method of claim 1, the first polygon corresponding to a first metal structure and the second polygon corresponding to a second metal structure adjacent to the first metal structure.

9. The method of claim 1, the width bias value derived from mask spacer fabrication data.

10. The method of claim 1, the identifying a second polygon comprising:
  determining that the second polygon has a direct neighbor relationship with the first polygon.

11. The method of claim 1, the identifying a second polygon comprising:
  determining that the second polygon has an in-direct neighbor relationship with the first polygon.

12. The method of claim 1, the design layout corresponding to at least one of a double patterning layout or a triple patterning layout.

13. The method of claim 1, the design layout corresponding to a multiple patterning layout.

14. The method of claim 1, the identifying a width bias table comprising:
  determining that the second polygon is associated with an aggressor mask based upon the second mask assignment;
  determining that the first polygon is associated with a victim mask based upon the first mask assignment, the first polygon affected by the aggressor mask during fabrication; and
  identifying the width bias table based upon the first polygon being associated with the victim mask and the second polygon being associated with the aggressor mask.

15. The method of claim 14, the determining that the second polygon is associated with an aggressor mask comprising:
  determining that a spacer structure is to be associated with the aggressor mask during fabrication, the spacer structure modifying a characteristic of the first polygon.

16. A system for width bias adjustment for a design layout, comprising:
  a width bias component operating on a first set of one or more processing units and configured to:
    receive a design layout of an integrated circuit;
    identify a first polygon having a first mask assignment within the design layout;
    identify a second polygon having a second mask assignment within the design layout;
    identify a width bias table based upon the first mask assignment and the second mask assignment, an identification of the width bias table comprising:
      determining that the second polygon is associated with an aggressor mask based upon the second mask assignment;
      determining that the first polygon is associated with a victim mask based upon the first mask assignment, the first polygon affected by the aggressor mask during fabrication; and
      identifying the width bias table based upon the first polygon being associated with the victim mask and the second polygon being associated with the aggressor mask;
    query the width bias table using a first width between the first polygon and the second polygon to determine a width bias value; and
    apply the width bias value to the design layout.

17. The system of claim 16, comprising:
  an adjustment component operating on a second set of one or more processing units and configured to:
    determine an electrical characteristic adjustment for the first polygon based upon the width bias value; and
    take the electrical characteristic adjustment into account during an RC extraction stage for the design layout.

18. The system of claim 16, the first mask assignment corresponding to a first mask and the second mask assignment corresponding to a second mask different than the first mask.

19. The system of claim 16, the first mask assignment corresponding to a first mask and the second mask assignment corresponding to the first mask.

20. A method for width bias adjustment for a design layout, comprising:
- receiving a selection of a first polygon within a design layout of an integrated circuit, the first polygon having a first mask assignment;
- identifying a second polygon having a neighboring relationship with the first polygon, the second polygon having a second mask assignment;
- determining an aggressor/victim relationship between a first mask used to form the first polygon and a second mask used to form the second polygon based upon the first mask assignment and the second mask assignment;
- exposing, through a design layout interface, a width bias adjustment user interface comprising a width bias table, the width bias table identified based upon the aggressor/victim relationship; and
- responsive to receiving a selection of a width bias value from the width bias table, applying the width bias value to the design layout,
- at least some of the method implemented at least in part via a processing unit.

* * * * *